(12) United States Patent
Yasunaga

(10) Patent No.: US 6,218,270 B1
(45) Date of Patent: Apr. 17, 2001

(54) METHOD OF MANUFACTURING SEMICONDUCTOR DEVICE HAVING SHALLOW JUNCTION

(75) Inventor: Tomoko Yasunaga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/261,223

(22) Filed: Mar. 3, 1999

(30) Foreign Application Priority Data

Mar. 4, 1998 (JP) .................................................. 10-052219

(51) Int. Cl.[7] .......................... H01L 21/425; H01L 21/04; H01L 21/26; H01L 21/324; H01L 21/42
(52) U.S. Cl. ........................ 438/530; 438/510; 438/795; 438/920
(58) Field of Search ................................... 438/530, 510, 438/514, 795, 920

(56) References Cited

FOREIGN PATENT DOCUMENTS 58-96763    6/1983  (JP) .

OTHER PUBLICATIONS

Taiwanese Office Action, dated Aug. 3, 2000, with English Translation.
Sze, S.M., VLSI Technology, McGraw–Hill: Jul., 1983, Chapter 6.

*Primary Examiner*—Richard Elms
*Assistant Examiner*—Adam Pyonin
(74) *Attorney, Agent, or Firm*—McGinn & Gibb, PLLC

(57) ABSTRACT

A method of manufacturing a semiconductor device having a silicon substrate containing an impurity diffusion layer is disclosed, that comprises the steps of doping impurities to the silicon substrate through a silicon oxide film with a thickness of 2.5 nm or less at an accelerating voltage of 3 keV or less, the silicon oxide film being formed on the silicon substrate and annealing the silicon substrate with the oxide film left.

17 Claims, 7 Drawing Sheets

IMPURITY DOPING

1: SILICON SUBSTRATE

ANNEALED IN NITROGEN ATMOSPHERE CONTAINING 100 ppm OR LESS OF CONCENTRATION OF OXYGEN

IMPURITY DOPING

2: SILICON OXIDE FILM (FILM THICKNESS: 2.5 nm)

1: SILICON SUBSTRATE

ANNEALED IN NITROGEN ATMOSPHERE CONTAINING 100 ppm OR LESS OF CONCENTRATION OF OXYGEN

ANNEALED IN NITROGEN ATMOSPHERE CONTAINING SEVERAL % OF OXYGEN

ANNEALED IN NITROGEN ATMOSPHERE

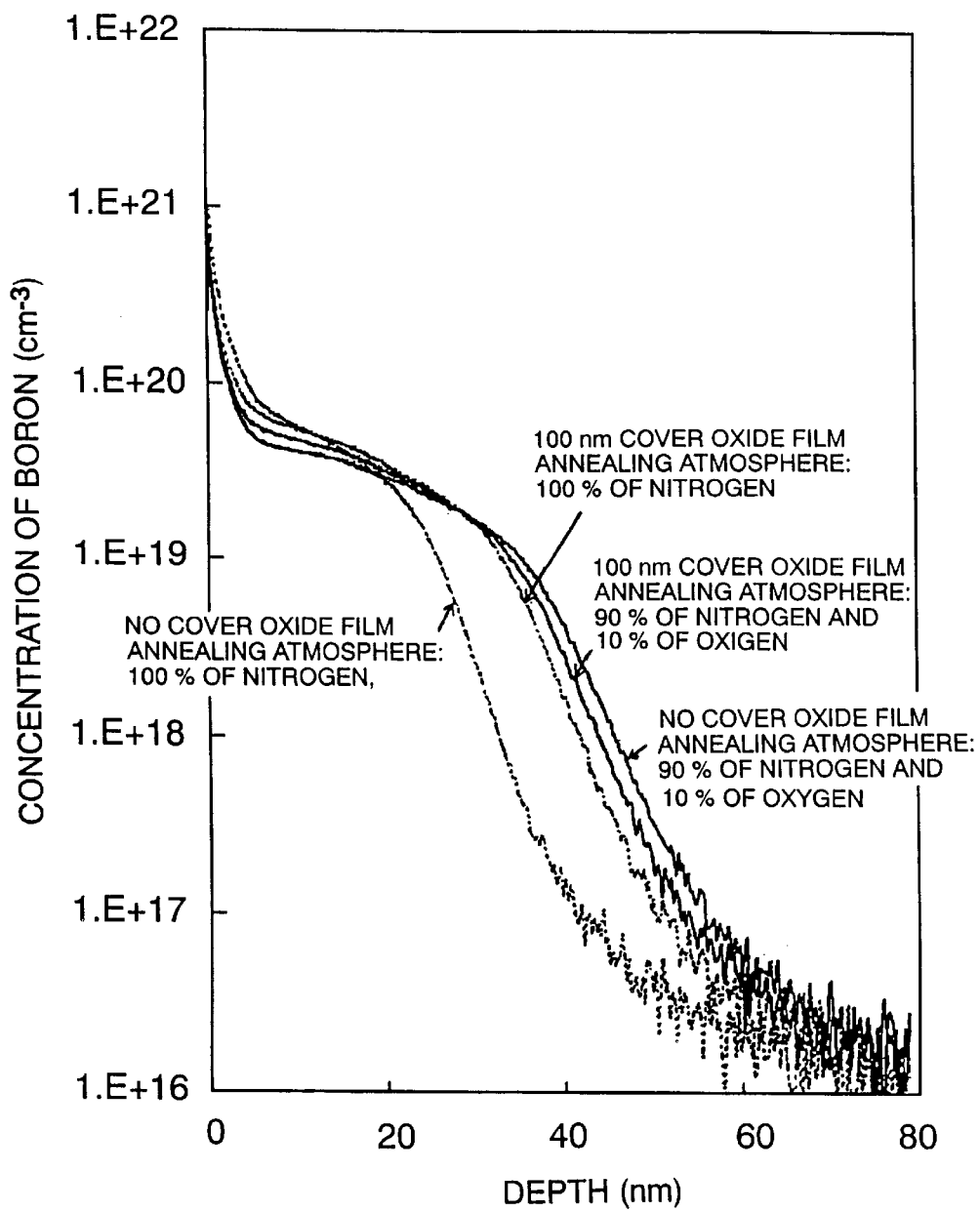

FIG.10
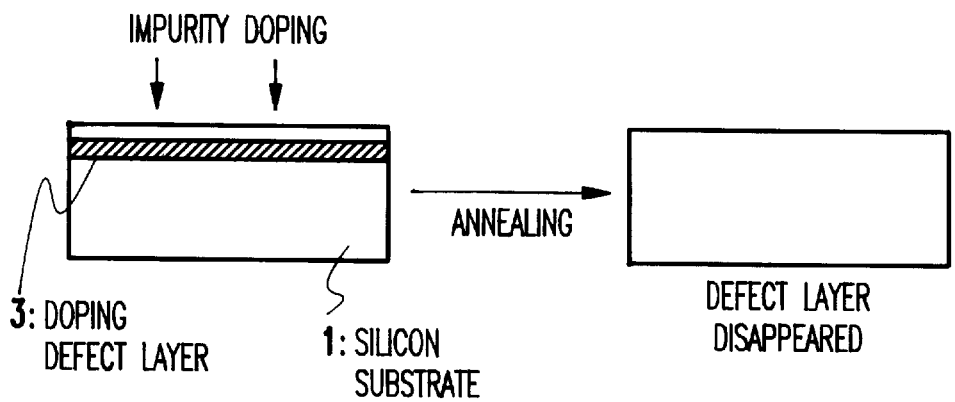
(a) SHALLOW DOPING
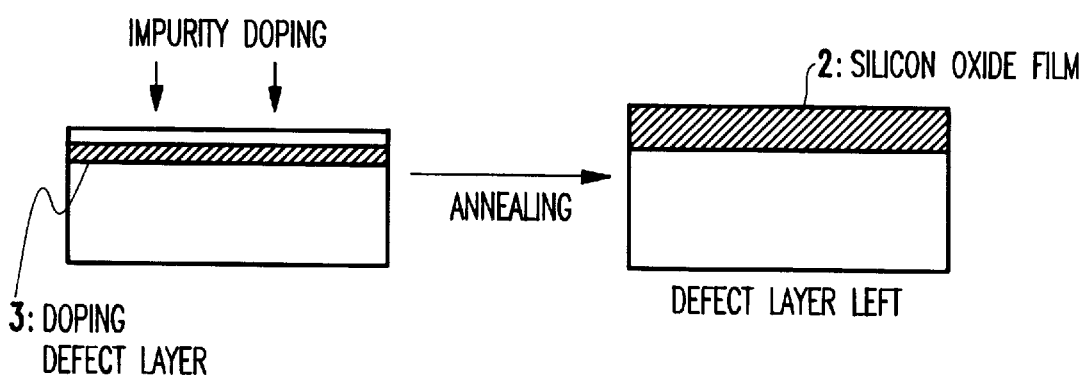
(b) SHALLOW DOPING; OXIDE FILM FORMED ON THE SURFACE UPON ANNEALING
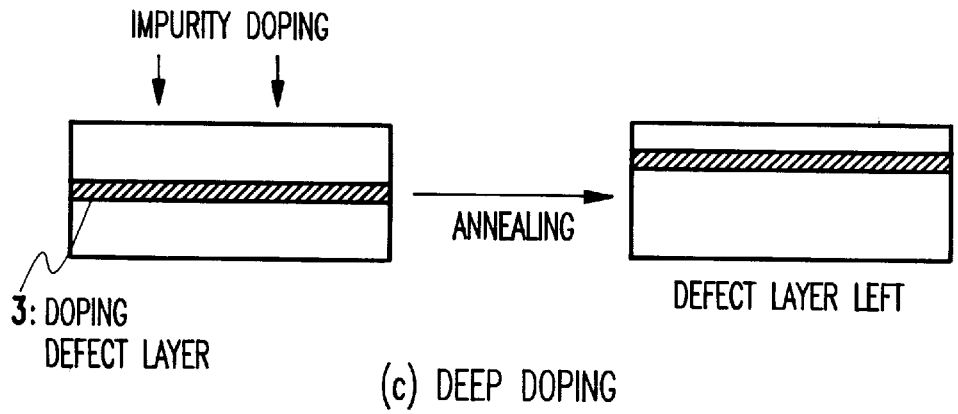
(c) DEEP DOPING

METHOD OF MANUFACTURING SEMICONDUCTOR DEVICE HAVING SHALLOW JUNCTION

BACKGROUND OF THE INVENTION

1. Field of the Invention

The present invention relates to a method of manufacturing a semiconductor device having an impurity diffusion layer, in particular, to a method of manufacturing a semiconductor device having shallow junctions.

2. Description of the Related Art

FIG. 3A and FIG. 3B show an example of prior art ion doping technologies. In this method, ions are directly doped to a substrate with an accelerating voltage of 5 to 80 keV. Thereafter, the substrate is annealed in a nitrogen atmosphere containing oxygen in the state that the front surface thereof is exposed so as to form a diffusion layer.

However, in such known methods, unnecessary impurities other than desired impurities would be doped to the substrate. In addition, when the ion doping process and the annealing process are performed, the front surface of the silicon substrate may be damaged.

To solve such a problem, a silicon oxide film is formed on the substrate. Ions are doped through the silicon oxide film (hereinafter, such an oxide film may be referred to as through-oxide film). This method has been disclosed in for example Japanese Patent Laid-Open Publication No. 58-96763. FIG. 4A and 4B show a practical method for forming a through-oxide film. In this method, a silicon oxide film with a thickness of 100 nm or more is formed on the front surface of a substrate. Ions are doped to the substrate through the silicon oxide film at an accelerating voltage of 40 keV. Thereafter, with the silicon oxide film left, the substrate is annealed in a nitrogen atmosphere. Alternatively, after the silicon oxide film is removed and then another silicon oxide film is formed, the substrate is annealed in a nitrogen atmosphere. Thus, a diffusion layer is formed on the substrate. In this method, unnecessary impurities other than desired impurities can be prevented from doped in the substrate.

In the above-described methods, the sheet resistance rises. Intensive studies by the inventor of the present invention show that impurities concentrate in an oxide film. Thus, the concentration of impurities in the diffusion layer decreases. In the silicon oxide film forming method, since doped impurities concentrate in the silicon oxide film, the concentration of impurities of the diffusion layer decreases. Likewise, in the direct ion doping method of which ions are directly doped to a substrate without a silicon oxide film, the substrate is annealed in a nitrogen atmosphere containing several % of oxide so as to prevent the front surface of the substrate from roughening. While the substrate is being annealed, since an oxide film is formed on the front surface of the substrate, impurities concentrate in the oxide film as with the silicon oxide film forming method. Thus, the concentration of the impurities in the diffusion layer decreases. Because of such reasons, in the conventional methods, the sheet resistance increases.

In addition, as semiconductor devices are finely structured, junctions are more shallowly diffused. To do that, it is necessary to lower the accelerating voltage of ions, in reality, 3 keV or less. However, it is difficult to sufficiently shallowly diffuse ions in the method of which ions are doped through the through-oxide film. In addition, the sheet resistance remarkably increases. Table 1 shows the relation between the presence/absence of oxide film and sheet resistance. From the table, it is clear that the doping energy of boron is inversely proportional to the sheet resistance of the through-oxide film.

TABLE 1

| Presence/Absence of through-oxide film in ion doping process | Absence | Presence 2.5 nm | Presence 50 nm | Absence |
|---|---|---|---|---|
| Presence/Absence of cover-oxide film in annealing process | Absence | Presence (leave through-oxide film as it is) | Presence (leave through-oxide film as it is) | Presence (deposited by 100 nm after removal of - oxide film) |
| Annealing atmosphere | Nitrogen atmosphere containing 100 ppm or less of oxygen | Nitrogen atmosphere containing oxygen (*1) | Nitrogen atmosphere containing oxygen | Nitrogen atmosphere containing oxygen |
| Boron doping condition | | | | |
| 0.5 keV 5 × 1014 cm-2 | 63.7 | 746.9 | 2373.0 | 675.3 |
| 1 keV 5 × 1014 cm-2 | 311.5 | 340.5 | 464.8 | |
| 2 keV 5 × 1014 cm-2 | 232.7 | 231.7 | 258.3 | |
| 5 keV 5 × 1014 cm-2 | 102.0 | | 99.3 | 108.9 |

Values in the table represent average values of sheet resistance values ($\Omega/\square$) at 49 points on the wafer.
(*1) "Nitrogen atmosphere containing oxygen" means a nitrogen atmosphere containing 100 ppm or more of oxygen.

In a doping process with ions of boron or ions of a compound thereof, when a silicon substrate is annealed with a silicon oxide film, ions of boron are more deeply diffused. Thus, junctions are more deeply diffused than designed values. Hereinafter, this phenomenon is referred to as "accelerating diffusion". Recent studies show that the accelerating diffusion takes place as a peculiar phenomenon upon doping of ions of boron or ions of a compound thereof.

An object of the present invention is to solve the above-mentioned problems contained in the prior art.

SUMMARY OF THE INVENTION

A first aspect of the present invention is a method of manufacturing a semiconductor device having a silicon substrate containing an impurity diffusion layer, comprising the steps of doping impurities to the silicon substrate through a silicon oxide film with a thickness of 2.5 nm or less at an accelerating voltage of 3 keV or less, the silicon oxide film being formed on the silicon substrate, and annealing the silicon substrate with the oxide film left.

A second aspect of the present invention is a method of manufacturing a semiconductor device having a silicon substrate containing an impurity diffusion layer, comprising the steps of doping impurities to the silicon substrate through a silicon oxide film with a thickness of 2.5 nm or less at an accelerating voltage of 3 keV or less, the silicon oxide film being formed on the silicon substrate, and removing the oxide film, forming a cover oxide film on the silicon substrate, and annealing the silicon substrate. The cover oxide film is a silicon oxide film that covers the front surface of a substrate that is annealed. The cover oxide film is formed by CVD method or the like. The thickness of the cover oxide film is not limited, but preferably around 100 nm.

A third aspect of the present invention is a method of manufacturing a semiconductor device having a silicon substrate containing an impurity diffusion layer, comprising the steps of doping impurities to the silicon substrate through a silicon oxide film with a thickness of 2.5 nm or less at an accelerating voltage of 3 keV or less, the silicon oxide film being formed on the silicon substrate, removing the oxide film, and annealing the silicon substrate in such a manner that the front surface of the silicon substrate is exposed.

A fourth aspect of the present invention is a method of manufacturing a semiconductor device having a silicon substrate containing an impurity diffusion layer, comprising the steps of directly doping impurities to the silicon substrate at an accelerating voltage of 3 keV or less, and annealing the silicon substrate in such a manner that the front surface of the silicon substrate is exposed.

According to the present invention, since the accelerating voltage is 3 keV or less and the thickness of the silicon oxide film on a silicon substrate to which impurities are doped is 2.5 nm or less, a shallow diffusion layer can be formed. In addition, since the silicon substrate is annealed with the silicon oxide film left or without the silicon oxide film, the thickness of the oxide film (cover oxide film) on the substrate that is annealed becomes 2.5 nm or less. Thus, impurities do not concentrate in the oxide film. Consequently, since the concentration of the impurities does not decrease, the sheet resistance does not decrease.

In addition, since the accelerating energy is 3 keV or less, when the thickness of the through-oxide film is decreased (in particular, when the through-oxide film is not formed), in the ion doping process, the front surface of the substrate can be satisfactorily suppressed from roughening.

The annealing step is preferably performed in a nitrogen atmosphere containing 100 ppm or less of oxygen. Thus, in the annealing process, an oxide film can be prevented from being formed on the front surface of the substrate. Consequently, impurities are prevented from concentrating in the oxide film on the substrate.

The annealing step is preferably performed at a temperature in the range from 1000° C. to 1100° C. Thus, in the annealing process, the front surface of the substrate can be prevented from roughening.

The impurities considered in the present invention are boron, boron fluoride, arsenic, phosphorus, or the like. When the impurities are boron or boron fluoride, the front surface of the substrate is preferably annealed without an oxide film. When impurities of a compound of boron are doped to the substrate with an oxide film, the sheet resistance will increase. In addition, the accelerating diffusion will take place.

Next, with reference to FIGS. 5 to 8, the phenomenon of the accelerating diffusion will be described. FIG. 5 is a graph showing the a distribution of concentration of ions of boron in the direction of a silicon substrate in the case that after ions of boron are doped directly to the silicon substrate without an oxide film, the silicon substrate is annealed in the condition that the front surface of the silicon substrate is exposed or a cover oxide film is formed on the front surface. The annealing atmosphere is an atmosphere of 100% of nitrogen (containing 100 ppm or less of oxygen) or an atmosphere of 90% of nitrogen and 10% of oxygen. The concentration of boron is measured by SIMS. The accelerating voltage of doped ions is 0.5 keV. The concentration of doped ions is $5 \times 10^{14}$ cm$^{-2}$. In FIG. 5, the horizontal axis represents the position in the direction of the depth of the substrate assuming that the origin is the front surface of the substrate. FIGS. 6, 7, and 8 show the relation between the accelerating voltage and accelerating diffusion distance in the case that impurities of boron, boron fluoride, and arsenic are used, respectively. From FIGS. 5 to 8, the following results are obtained.

(1) The accelerating diffusion takes place when impurities of a compound of boron are doped.
(2) The accelerating diffusion takes place when a cover oxide film is formed on the front surface of a substrate.
(3) Even if no cover oxide film is formed, when a substrate is annealed in an atmosphere containing oxygen, the accelerating diffusion takes place.
(4) The accelerating diffusion remarkably takes place when the accelerating voltage is low (the doping depth is low).

Thus, when impurities of a compound of boron are used, it is preferred to anneal a substrate without a cover oxide film or in an atmosphere that does not contain oxygen. Consequently, the accelerating diffusion can be effectively suppressed.

As described above, when the accelerating voltage is low (the doping depth is low), the accelerating diffusion remarkably takes place. Although the reason of the occurrence of the accelerating diffusion in such a case is currently not clear, the inventor of the present invention has the following assumption.

FIGS. 10A, 10B, ad 10C are schematic diagrams for explaining the mechanism of the accelerating diffusion. When ions are doped to a silicon substrate, point defects take place in the silicon substrate. When the silicon substrate is annealed, the point defects move to the front surface of the substrate. When the doping depth of ions is low, the point defect layer moves to the front surface of the substrate and disappears (see FIG. 10A). On the other hand, when the silicon substrate is annealed with a cover oxide film, the cover oxide film prevents the point defect layer from moving to the front surface of the silicon substrate. Thus, the point defect layer is left in the substrate (see FIG. 10B). In the substrate that contains the point defect layer, since the diffusion speed of impurities increases, it is assumed that the accelerating diffusion takes place.

On the other hand, when the doping depth is large, since the distance from the point defect layer to the front surface of the substrate is large, even if a cover oxide film is not formed on the front surface of the substrate, the point defect layer does not move to the front surface of the substrate. Thus, the point defect layer is left in the substrate (see FIG. 10C). Consequently, since there is no difference of the diffusion distance due to the presence/absence of the cover oxide film, it is assumed that the accelerating diffusion does not take place. In addition, it is assumed that when impurities of boron or a compound thereof are doped, such a phenomenon peculiarly takes place because the size of point defects due to the impurities is large.

A fifth aspect of the present invention is a method of manufacturing a semiconductor device having a silicon substrate containing an arsenic diffusion layer, comprising the steps of doping arsenic to the silicon substrate through a silicon oxide film with a thickness d expressed by the following formula (1) at an accelerating voltage of 3 keV or less, the silicon oxide film being formed on the silicon substrate, and removing the oxide film and annealing the silicon substrate, or annealing the silicon substrate with the oxide film left $$d \leq V/1.3 \tag{1}$$

where d is the thickness of the silicon oxide film (nm), and V is the accelerating voltage (keV).

A sixth aspect of the present invention is a method of manufacturing a semiconductor device having a silicon substrate containing a boron diffusion layer, comprising the steps of doping boron to the silicon substrate through a silicon oxide film with a thickness d expressed by the following formula (2) at an accelerating voltage of 3 keV or less, the silicon oxide film being formed on the silicon substrate, and removing the oxide film and annealing the silicon substrate, or annealing the silicon substrate with the oxide film left $$d \leq V/0.75 \tag{2}$$

where d is the thickness of the silicon oxide film (nm), and V is the accelerating voltage (keV).

A seventh aspect of the present invention is a method of manufacturing a semiconductor device having a silicon substrate containing a boron fluoride diffusion layer, comprising the steps of doping boron fluoride to the silicon substrate through a silicon oxide film with a thickness d expressed by the following formula (3) at an accelerating voltage of 3 keV or less, the silicon oxide film being formed on the silicon substrate, and removing the oxide film and annealing the silicon substrate, or annealing the silicon substrate with the oxide film left $$d \leq V/1.0 \tag{3}$$

where d is the thickness of the silicon oxide film (nm), and V is the accelerating voltage (keV).

To prevent the sheet resistance from decreasing, it is effective to limit the thickness of the cover oxide film to a predetermined value. However, the critical value of the thickness of the cover oxide film depends on the type of impurities and the accelerating energy of doped ions. Studies of the inventor of the present invention reveal the relation between the accelerating voltage and the critical value of the thickness of the silicon oxide film for each type of impurities. Each aspect of the present invention discloses the optimum thickness of the through-oxide film. According to each aspect of the present invention, shallow diffusion junctions that prevent the concentration of impurities in a diffusion layer from decreasing and the sheet resistance from increasing can be accomplished.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 5 is a graph showing the phenomenon of an accelerating diffusion of boron;

FIG. 10A, FIG. 10B, and FIG. 10C are schematic diagrams for explaining the mechanism of which the accelerating diffusion takes place;

DESCRIPTION OF PREFERRED EMBODIMENTS

Figure 1A:
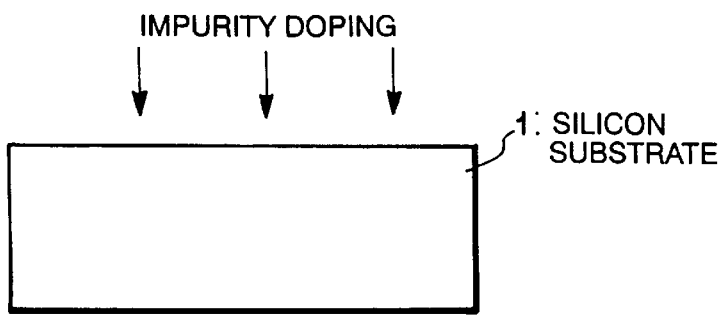
FIG. 1A and FIG. 1B are schematic diagrams showing an example of a method of manufacturing a semiconductor device according to the present invention.
Figure 1B:
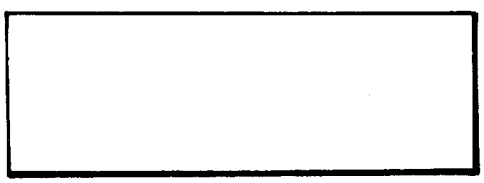

Next, with reference to the accompanying drawings, embodiments of the present invention will be described. FIGS. 1A and 1B are schematic diagrams showing an example of a method of manufacturing a semiconductor device according to the present invention. In the method, ions of impurities are doped to the front surface of a wafer without a through-oxide film. The ions are doped at an accelerating voltage of 3 keV or less. At such an accelerating voltage, shallow junctions are preferably formed. Thus, in the ion doping process, the front surface thereof can be sufficiently suppressed from roughening. The impurities considered in the present invention are boron, boron fluoride, phosphorus, arsenic, antimony, or the like that are conventionally used for doping carriers. According to the present invention, the concentration of doped ions is not limited. In other words, the concentration can be properly set.

After ions of impurities are doped to a substrate, the impurities are heat-diffused in the substrate. To remove crystal defects that have taken place in the ion doping process, the substrate is annealed. In this example, the substrate is annealed without a cover oxide film. The annealing atmosphere is a nitrogen atmosphere containing 100 ppm or less of oxygen. Since the content of oxygen is 100 ppm or less, an oxide film is hardly formed on the front surface of the substrate. Thus, the impurities can be prevented from concentrating. The content of oxygen in the nitrogen atmosphere is preferably 50 ppm or less. In such conditions, an oxide film is not formed. In addition, impurities do not concentrate. According to the present invention, the annealing method is not limited. However, from a point of view of shallow junctions, it is preferred to use RTA (Rapid Thermal Annealing) method.

Figure 2A:
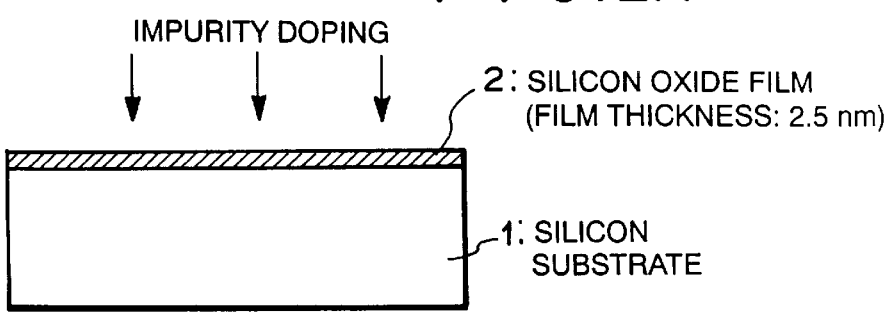
FIG. 2A and FIG. 2B are schematic diagrams showing an example of a method of manufacturing a semiconductor device according to the present invention.
Figure 2B:
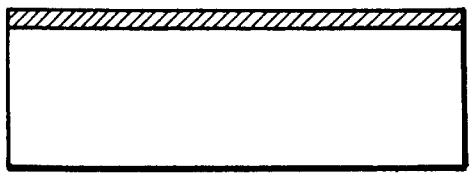
Figure 3A:
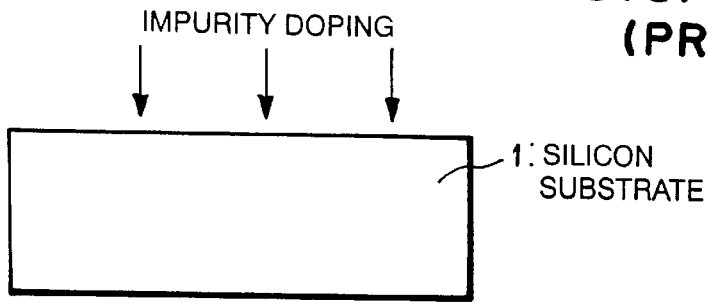
FIG. 3A and FIG. 3B are schematic diagrams showing an example of a conventional manufacturing method of a semiconductor device.
Figure 3B:
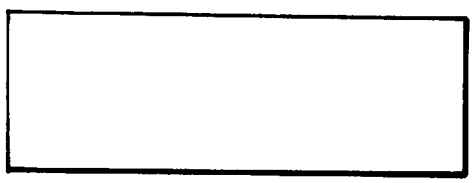
Figure 4A:
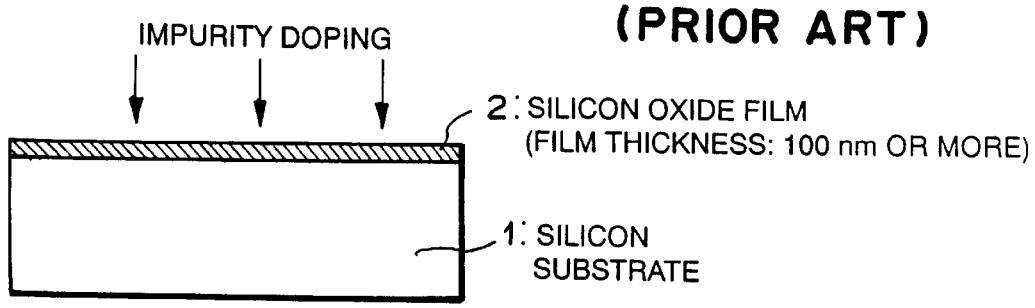
FIG. 4A and FIG. 4B are schematic diagrams showing an example of a conventional method of manufacturing a semiconductor device.
Figure 4B:
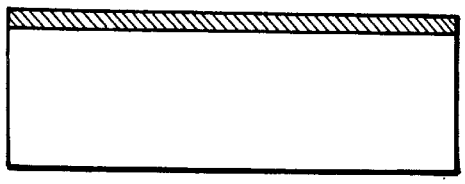
Figure 6:
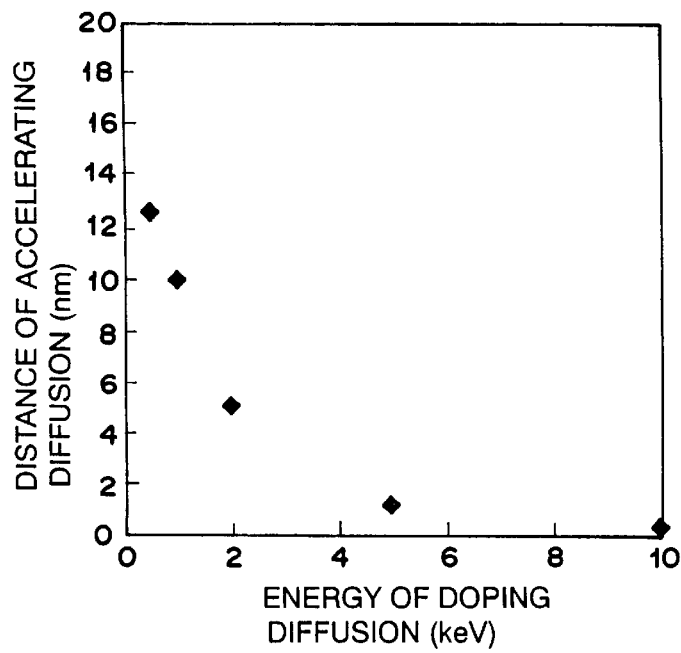
FIG. 6 is a graph showing the relation between doping diffusion energy (accelerating voltage of doped ions) and accelerating diffusion distance in the case that impurities of boron are doped.
Figure 7:
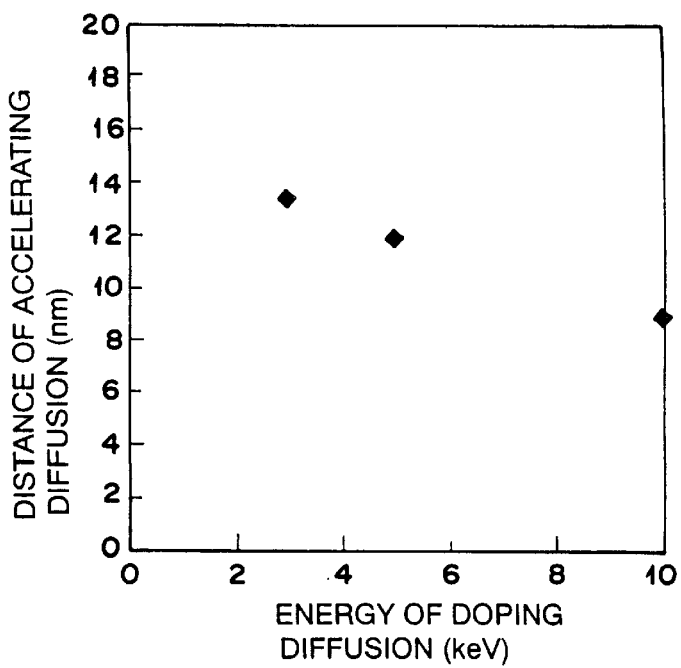
FIG. 7 is a graph showing the relation between accelerating voltage of doped ions and acceleration diffusing distance in the case that impurities of boron fluoride are doped.
Figure 8:
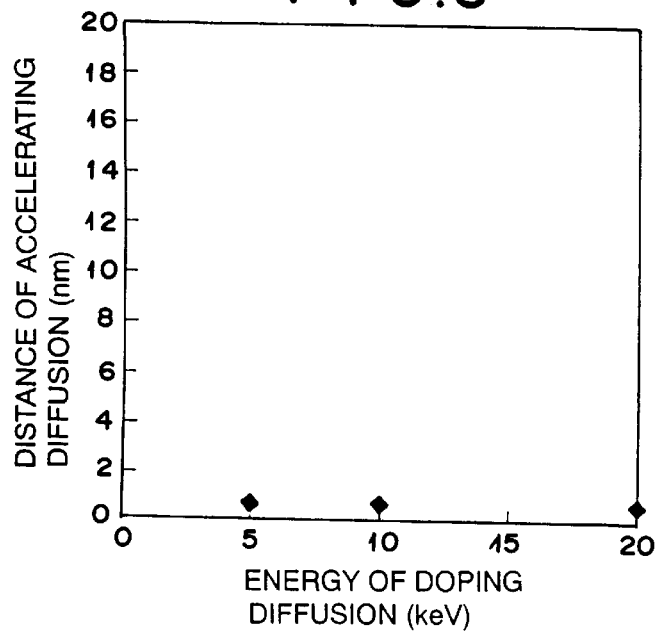
FIG. 8 is a graph showing the relation between accelerating voltage of ion doping and accelerating diffusion distance in the case that impurities of arsenic are doped.

FIGS. 2A and 2B are schematic diagrams showing an example of a method of manufacturing a semiconductor device according to the present invention. A silicon oxide film with a thickness of 2.5 nm was formed on the front surface of a silicon wafer. Next, ions of boron were doped to the silicon wafer through the silicon oxide film. As the ion doping conditions, the accelerating voltage was 2 keV and the concentration of doped ions was $5 \times 10^{14}$ cm$^{-2}$. After the ions were doped, the silicon wafer was annealed with the silicon oxide film by the RTA method. The annealing atmosphere was a nitrogen atmosphere containing 100 ppm or less of oxygen. The temperature profile was as follows. The temperature of the wafer was raised from the room temperature to 500° C. in 10 seconds. The temperature of the wafer was kept at 500° C. for 30 seconds. Thereafter, the temperature of the wafer was raised to 1000° C. in 10 seconds. The temperature of the wafer was kept at 100° C. for 10 seconds. Thereafter, the wafer was quickly cooled (normally, 100 to 150° C./second).

In the above-described method, a diffusion layer was formed on the silicon wafer. The sheet resistance at 49 points on the front surface of the silicon wafer was measured. The average of the sheet resistance at the 49 points was 231.7 $\Omega/\square$. In the case of a wafer of which ions were doped without the silicon oxide film and then annealed, the average of the sheet resistance was 232.7 $\Omega/\square$. Thus, the resistance of both the wafers was almost the same. In other words, even if a silicon oxide film with a thickness of 2.5 nm is formed, the resistance does not increase.

Figure 11:
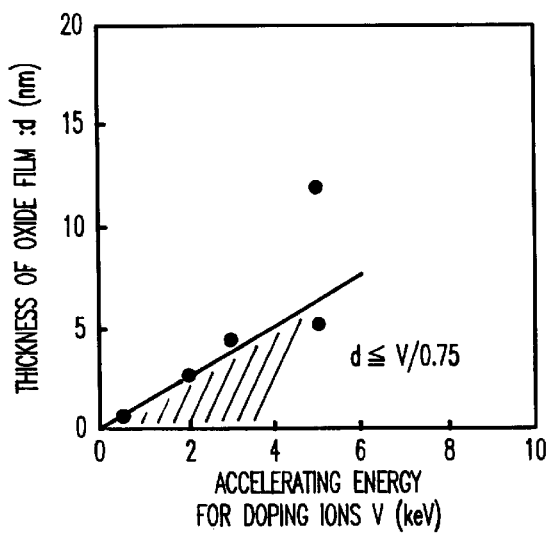
FIG. 11 is a graph showing the relation among the ion accelerating energy, the thickness of a silicon oxide film, and the sheet resistance in the case that impurities of boron are doped.

In the same method, the sheet resistance was evaluated by varying the ion accelerating voltage and the thickness of the silicon oxide film. FIG. 11 shows the evaluated results of the sheet resistance. In FIG. 11, blank dots represent a condition of which the increase of the sheet resistance is 1% or less in comparison with ions are doped to a wafer without a silicon oxide film and then the wafer is annealed. When the increase of the sheet resistance is 1% or less, no problem practically takes place. The reference of 1% is defined in consideration of the reproducibility of the process and the accuracy of a measuring unit for the sheet resistance. In FIG. 11, a measured point of which the accelerating voltage is 2 keV and the thickness of the silicon oxide film is 2.5 nm is denoted by a black dot. In other words, at the measured point, the increase of the sheet resistance is less than 1% in comparison with the case that a diffusion layer is formed in the same ion doping condition, the same annealing condition, and other manufacturing condition except that the silicon oxide film is not formed (in this case, as described above, the sheet resistance without the oxide film was 232.7 $\Omega/\square$ and the sheet resistance with the oxide film was 231.7 $\Omega/\square$).

Thus, as the evaluated results shown in FIG. 11, when ions of boron are doped, if the thickness d of the silicon oxide film satisfies the following formula, it is clear that a good sheet resistance value can be obtained.

$$d \leq V/0.75$$

(where d is the thickness of the silicon oxide film (nm); and V is the accelerating voltage (keV)).

Figure 12:
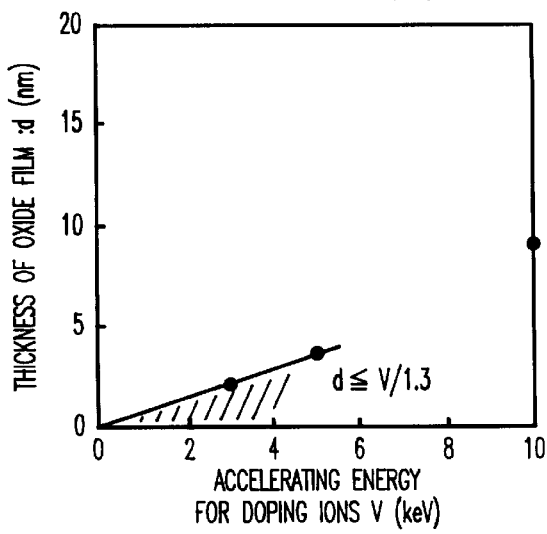
FIG. 12 is a graph showing the relation among the ion accelerating energy, the thickness of a silicon oxide film, and the sheet resistance in the case that impurities of arsenic are doped.
Figure 13:
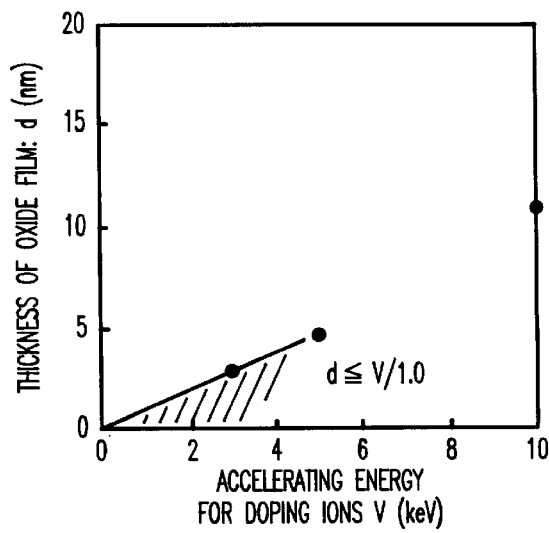
FIG. 13 is a graph showing the relation among the ion accelerating energy, the thickness of a silicon oxide, and the sheet resistance in the case that impurities of boron fluoride are doped.

In the same method as described above, the sheet resistance was evaluated by varying the accelerating voltage and the thickness of the silicon oxide film for impurities of other than boron. FIGS. 12 and 13 show the evaluated results for arsenic and boron fluoride, respectively. From FIG. 12, when ions of arsenic are doped, if the thickness d of the silicon oxide film satisfies the following formula, a good sheet resistance value can be obtained.

$$d \leq V/1.3$$

(where d is the thickness of the silicon oxide film (nm); and V is the accelerating voltage (keV))

From FIG. 13, when ions of boron fluoride are doped, if the thickness d of the silicon oxide film satisfies the following formula, a good sheet resistance value can be obtained.

$$d \leq V/1.0$$

(where d is the thickness of the silicon oxide film (nm); and V is the accelerating voltage (keV)).

Although the relation between the upper limit of the thickness of the silicon oxide film and the accelerating voltage is not represented for phosphorus, it is clear that there is a particular relation between them.

Figure 9:
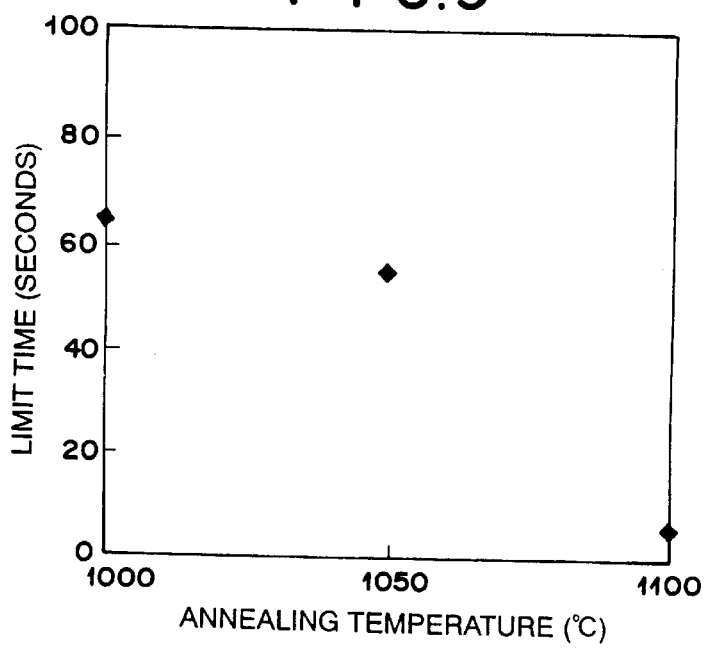
FIG. 9 is a graph showing the relation between annealing temperature and limit time in the case that impurities of boron are doped.

When a wafer is annealed in a nitrogen atmosphere (containing 100 ppm or less of oxygen) without a cover oxide film, the annealing process is preferably completed in a predetermined limit time so as to prevent the front surface of the wafer from roughening. Next, with reference to FIG. 9, the "limit time" will be described. FIG. 9 shows the limit time in the case that ions of boron are doped. In the case that ions of boron are doped to a wafer without a cover oxide film and the wafer is annealed in an atmosphere of 100% of nitrogen, when a predetermined time period elapses, the front surface of the wafer roughens. The time period of which the front surface of the wafer roughens is referred to as limit time. In FIG. 9, the limit time is defined as follows. Ions of boron are doped to a wafer in the conditions of 1 keV and $1 \times 10^{15}$ cm$^{-2}$. Thereafter, the wafer is annealed in an atmosphere of 100% of nitrogen. The time period of which the surface roughness of a bare wafer is maintained is defined as the limit time. In this case, the surface roughness is represented by Ra value of AFM measurement.

As described above, in a method of manufacturing a semiconductor device according to the present invention, since the thickness of an oxide film formed on the front surface of a substrate is kept to a predetermined value in an ion doping process and an annealing process, the concentration of impurities in a diffusion layer can be prevented from decreasing. Thus, shallow diffusion junctions can be accomplished without an increase of the sheet resistance.

In particular, ions of a boron or ions of a compound thereof are doped to the front surface of a wafer and then the wafer is annealed in a nitrogen atmosphere containing 100 ppm or less of oxygen. Thus, the sheet resistance can be prevented from increasing. In addition, the problem of the increasing diffusion can be solved. Consequently, shallow diffusion junctions can be accomplished as designed.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method of manufacturing a semiconductor device having a silicon substrate containing an impurity diffusion layer, comprising:

doping impurities to the silicon substrate through a silicon oxide film with a thickness of 2.5 nm or less at an accelerating voltage of 3 keV or less, the silicon oxide film being formed on a front surface of the silicon substrate; and annealing the silicon substrate with the oxide film remaining after doping, whereby forming the diffusion layer.

2. A method of manufacturing a semiconductor device having a silicon substrate containing an impurity diffusion layer, comprising:

doping impurities to the silicon substrate through a silicon oxide film with a thickness of 2.5 nm or less at an accelerating voltage of 3 keV or less, the silicon oxide film being formed on a front surface of the silicon substrate;

removing the oxide film;

forming a cover oxide film on the front surface of the silicon substrate; and annealing the silicon substrate, whereby forming the diffusion layer.

3. A method of manufacturing a semiconductor device having a silicon substrate containing an impurity diffusion layer, comprising:

doping impurities to the silicon substrate through a silicon oxide film with a thickness of 2.5 nm or less at an accelerating voltage of 3 keV or less, the silicon oxide film being formed on a front surface of the silicon substrate;

removing the oxide film; and annealing the silicon substrate with the front surface of the silicon substrate exposed, whereby forming the diffusion layer.

4. The method as set forth in claim 3, wherein the impurities are boron or boron fluoride.

5. The method as set forth in claim 3, wherein the annealing step is performed in a nitrogen atmosphere containing 100 ppm or less of oxygen.

6. The method as set forth in claim 5, wherein the impurities are boron or boron fluoride.

7. The method as set forth in claim 6, wherein the annealing step is performed at a temperature in the range from 1000° C. to 1100° C.

8. The method as set forth in claim 7, wherein the impurities are boron or boron fluoride.

9. A method of manufacturing a semiconductor device having a silicon substrate containing an impurity diffusion layer, comprising:

directly doping impurities to the silicon substrate at an accelerating voltage of 3 keV or less; and annealing the silicon substrate with a front surface of the silicon substrate exposed, whereby forming the diffusion layer.

10. The method as set forth in claim 9, wherein the impurities are boron or boron fluoride.

11. The method as set forth in claim 4, wherein the annealing the silicon substrate is performed in a nitrogen atmosphere containing 100 ppm or less of oxygen.

12. The method as set forth in claim 11, wherein the impurities are boron or boron fluoride.

13. The method as set forth in claim 11, wherein the annealing the silicon substrate is performed at a temperature in the range of 1000° C. to 1100° C.

14. The method as set forth in claim 13, wherein the impurities are boron or boron fluoride.

15. A method of manufacturing a semiconductor device having a silicon substrate containing an arsenic diffusion layer, comprising:

doping arsenic to the silicon substrate through a silicon oxide film with a thickness d expressed by the following formula (1) at an accelerating voltage of 3 keV or less, the silicon oxide film being formed on a front surface of the silicon substrate; and removing the oxide film and annealing the silicon substrate; or annealing the silicon substrate with the oxide film remaining after doping $$d \leq V/1.3 \tag{1}$$

where d is the thickness of the silicon oxide film (nm); and V is the accelerating voltage (keV).

16. A method of manufacturing a semiconductor device having a silicon substrate containing a boron diffusion layer, comprising:

doping boron to the silicon substrate through a silicon oxide film with a thickness d expressed by the following formula (2) at an accelerating voltage of 3 keV or less, the silicon oxide film being formed on a front surface of the silicon substrate; and removing the oxide film and annealing the silicon substrate; or annealing the silicon substrate with the oxide film remaining after doping $$d \leq V/0.75 \tag{2}$$

where d is the thickness of the silicon oxide film (nm); and V is the accelerating voltage (keV).

17. A method of manufacturing a semiconductor device having a silicon substrate containing a boron fluoride diffusion layer, comprising:

doping boron fluoride to the silicon substrate through a silicon oxide film with a thickness d expressed by the following formula (3) at an accelerating voltage of 3 keV or less, the silicon oxide film being formed on the silicon substrate; and removing the oxide film and annealing the silicon substrate; or annealing the silicon substrate with the oxide film remaining after doping $$d \leq V/1.0 \tag{3}$$

where d is the thickness of the silicon oxide film (nm); and V is the accelerating voltage (keV).

* * * * *